United States Patent
Wong et al.

(10) Patent No.: US 7,429,503 B2
(45) Date of Patent: Sep. 30, 2008

(54) METHOD OF MANUFACTURING WELL PICK-UP STRUCTURE OF NON-VOLATILE MEMORY

(75) Inventors: Wei-Zhe Wong, Tainan (TW); Pin-Yao Wang, Hsinchu (TW)

(73) Assignees: Powerchip Semiconductor Corp., Hsinchu (TW); Renesas Technology Corp., Tokyo (JP)

( * ) Notice: Subject to any disclaimer, the term of this patent is extended or adjusted under 35 U.S.C. 154(b) by 0 days.

(21) Appl. No.: 11/668,476

(22) Filed: Jan. 30, 2007

(65) Prior Publication Data

US 2008/0124844 A1 May 29, 2008

(30) Foreign Application Priority Data

Aug. 21, 2006 (TW) ............................. 95130615 A (51) Int. Cl.
*H01L 21/82* (2006.01)
(52) U.S. Cl. ................. 438/130; 257/E21.616
(58) Field of Classification Search ................ 438/183, 438/257–267, 128, 130; 257/314–322, E21.616
See application file for complete search history.

(56) References Cited

U.S. PATENT DOCUMENTS

| 6,483,749 B1 * | 11/2002 | Choi et al. ............. 365/185.18 |
| 2002/0175378 A1 * | 11/2002 | Choe et al. .................. 257/355 |
| 2007/0080380 A1 * | 4/2007 | Chang ........................ 257/274 |

* cited by examiner

*Primary Examiner*—Hsien Ming Lee
*Assistant Examiner*—Kevin A Parendo
(74) *Attorney, Agent, or Firm*—Jianq Chyun IP Office (57) ABSTRACT

A method of manufacturing a well pick-up structure of a non-volatile memory is provided. A substrate including a first conductive type well, device isolation structures and dummy memory columns is provided. Each of the dummy memory columns includes a second conductive type source region and a second conductive type drain region. A first interlayer insulating layer with an opening is formed over the substrate, and the opening exposes the two adjacent second conductive type drain regions and the device isolation structure between the two adjacent second conductive type drain regions. A portion of the device isolation structure exposed by the opening is removed, and then a first conductive type well extension doped region is formed in the substrate exposed by the opening. A well pick-up conductive layer is formed in the opening. Dummy bit lines electrically connecting the well pick-up conductive layer are formed over the substrate.

20 Claims, 12 Drawing Sheets

METHOD OF MANUFACTURING WELL PICK-UP STRUCTURE OF NON-VOLATILE MEMORY

CROSS-REFERENCE TO RELATED APPLICATION

This application claims the priority benefit of Taiwan application serial no. 95130615, filed Aug. 21, 2006. All disclosure of the Taiwan application is incorporated herein by reference.

BACKGROUND OF THE INVENTION

1. Field of the Invention

The present invention relates to a method of manufacturing a semiconductor device, more particularly, to a method of manufacturing a well pick-up structure of a non-volatile memory.

2. Description of Related Art

Non-volatile memory is a type of memory that has been widely used inside personal computer systems and electron equipments. Data can be stored, read out or erased from the non-volatile memory countless number of times and any stored data is retained even after power supplying the devices is cut off.

In general, the non-volatile memory cell is comprised of a stacked gate including a floating gate and a control gate made of doped polysilicon. The floating gate is disposed between the control gate and the substrate and in a floated state that is not electrically connected with any circuit. The control gate is electrically connected with the word line. In addition, a tunneling oxide layer is disposed between the substrate and the floating gate while an inter-gate dielectric layer is located between the floating gate and the control gate.

On the other hand, flash memory arrays that are often used in the manufacturing industries include NOR (Not-OR)-type and NAND (Not-AND)-type arrays. In the NAND-type array non-volatile memory structure, various memory cells are connected in series so as to provide a superior integrated density and area utilization compared with the NOR-type array non-volatile memory, and it has been widely used in various electronic products.

In the conventional NAND-type non-volatile memory, a cell well is disposed in the substrate. Because the resistance of the cell well is high, the device channel region has a poor conductivity, such that the device operating speed and the device performance are affected. Therefore, sufficient well pick-up structures are usually formed in the conventional NAND-type non-volatile memory to reduce the resistance of the well. For example, when the reading operation of the NAND non-volatile memory is performed, the well pick-up structure can maintain the cell well at a fine ground state to prevent the memory threshold voltage distribution from becoming wide. When the erasing operation for the NAND-type non-volatile memory is performed, the well pick-up structure can be used to rapidly charge the cell well to an erasing voltage (about 20 V) so as to increase the erasing speed.

Currently, there are two methods for forming the well pick-up structures. One method is that when defining the active region, a partial region along the extension direction of the active region in the memory array is remained to be a region for the well pick-up structure. Since this well pick-up structure is located in the memory array so that a partial area of the word line is occupied. Moreover, the region for the well pick-up structure has a width different from that of the word line. When defining the active region, the line widths are not uniform because of optical proximity effect. The masks for forming the word lines, bit line plugs and bit lines should be precisely adjusted, and thus the process window is reduced. The other method is that a partial region along the bit line between two memory arrays is remained to be a region for the well pick-up structure. Similarly, this well pick-up structure also occupies a partial area of the bit line, and the line widths are not uniform because of optical proximity effect, such that the process window is reduced.

SUMMARY OF THE INVENTION

One objective of the present invention is to provide a method of manufacturing a well pick-up structure of a non-volatile memory capable of not occupying the area of the word line or bit line to increase the device integrated density.

Another objective of the present invention is to provide a method of manufacturing a well pick-up structure of a non-volatile memory, wherein the method is simple and the non-uniform line width problem due to optical proximity effect can be avoided, such that the cost for manufacturing the precise mask can be reduced and the process window is increased.

The present invention provides a method of manufacturing a well pick-up structure of a non-volatile memory including the following steps. A substrate having a first conductive type well therein is provided. A plurality of device isolation structures are formed in the substrate and a plurality of dummy memory columns are formed on the substrate. Each of the dummy memory columns includes a second conductive type source region and a second conductive type drain region. After forming a first interlayer insulating layer over the substrate, an opening is formed in the first interlayer insulating layer. The opening exposes the second conductive type drain regions and the device isolation structure between the second conductive type source regions of the dummy memory columns. A portion of the device isolation structure exposed by the opening is removed, and then a first conductive type well extension doped region is formed in the substrate exposed by the opening. A well pick-up conductive layer is formed in the opening, wherein the well pick-up conductive layer is electrically connected to the first conductive type well through the first conductive type well extension doped region. Thereafter, a plurality of dummy bit lines are formed over the substrate, wherein the dummy bit lines are electrically connected to the well pick-up conductive layer.

According to an embodiment of the present invention, the well pick-up conductive layer is formed by forming a first conductive material layer over the substrate to fill up the opening, and then removing the first conductive material layer on the first interlayer insulating layer to form the well pick-up conductive layer in the opening.

According to an embodiment of the present invention, the material of the first conductive material layer comprises tungsten, copper or aluminum.

According to an embodiment of the present invention, the first conductive material layer on the first interlayer insulating layer is removed by chemical-mechanical polishing process.

According to an embodiment of the present invention, the method further comprises forming an adhesive layer/barrier layer after forming the opening in the interlayer insulating layer and before forming the well pick-up conductive layer in the opening.

According to an embodiment of the present invention, the material of the adhesive layer/barrier layer is selected from the group consisting of tantalum, tantalum nitride, titanium, titanium nitride and combinations thereof.

According to an embodiment of the present invention, the method further comprises performing a rapid thermal annealing process after forming the first conductive type well extension doped region.

According to an embodiment of the present invention, the method further comprises forming a plurality of plugs over the substrate for electrically connecting the dummy bit lines and the well pick-up conductive layer.

According to an embodiment of the present invention, the plugs are formed by forming a second interlayer insulating layer over the substrate; patterning the second interlayer insulating layer and the first interlayer insulating layer to form a plurality of plug openings exposing the well pick-up conductive layer; forming a second conductive material layer on the second interlayer insulating layer to fill up the plug openings; and removing a portion of the second conductive material layer on the second interlayer insulating layer.

According to an embodiment of the present invention, the material of the second conductive material layer comprises tungsten, copper, aluminum or doped polysilicon.

According to an embodiment of the present invention, the opening in the first interlayer insulating layer is formed by forming a patterned mask layer on the first interlayer insulating layer; removing a portion of the first interlayer insulating layer by using the mask layer as a mask to form the opening; and removing the mask layer.

The present invention provides a method of manufacturing a well pick-up structure of a non-volatile memory including the following steps. A substrate having a first conductive type well therein is provided. Next, a plurality of device isolation structures are formed in the substrate, wherein the device isolation structures extend toward a first direction. A plurality of memory columns are formed on the substrate. Each of the memory columns includes a second conductive type source region and a second conductive type drain region. Then, a first interlayer insulating layer is formed over the substrate, and an opening and a trench are formed in the first interlayer insulating layer. The opening exposes the two adjacent second conductive type drain regions and the device isolation structure between the two adjacent second conductive type drain regions of the memory columns. The trench extends toward a second direction and exposes the second conductive type source regions, wherein the second direction interlaces the first direction. A portion of the device isolation structure exposed by the opening is removed, and then a first conductive type well extension doped region is formed in the substrate exposed by the opening. A well pick-up conductive layer is formed in the opening and a source line is formed in the trench. The well pick-up conductive layer is electrically connected to the first conductive type well through the first conductive type well extension doped region. Thereafter, a plurality of bit lines and a plurality of dummy bit lines are formed over the substrate, wherein the bit lines are electrically connected to the second conductive type source regions, the dummy bit lines are respectively electrically connected to the well pick-up conductive layer and the source line, and dummy bit lines between the well pick-up conductive layer and the source line are open.

According to an embodiment of the present invention, the well pick-up conductive layer and the source line are formed by forming a first conductive material layer over the substrate to fill up the opening and the trench; and removing the first conductive material layer on the first interlayer insulating layer to form the well pick-up conductive layer in the opening and form the source line in the trench.

According to an embodiment of the present invention, the first conductive material layer on the first interlayer insulating layer is removed by chemical-mechanical polishing process.

According to an embodiment of the present invention, the material for the first conductive material layer comprises tungsten, copper or aluminum.

According to an embodiment of the present invention, the method further comprises forming a mask layer covering the trench and exposing the opening on the first interlayer insulating layer before removing a portion of the device isolation structure in the opening; and removing the mask layer after forming the first conductive type well extension doped region in the substrate.

According to an embodiment of the present invention, the method further comprises performing a rapid thermal annealing process after forming the first conductive type well extension doped region.

According to an embodiment of the present invention, the method further comprises a plurality of first plugs electrically connecting the bit lines and the second conductive type drain regions, a plurality of second plugs electrically connecting the dummy bit lines and the well pick-up conductive layer and a plurality of third plugs electrically connecting the dummy bit lines and the source line.

According to an embodiment of the present invention, the first plugs, the second plugs and the third plugs are formed by forming a second interlayer insulating layer over the substrate; patterning the second interlayer insulating layer and the first interlayer insulating layer to form a plurality of first plus openings exposing the second conductive type drain regions, a plurality of second plus openings exposing the well pick-up conductive layer and a plurality of third plus openings exposing the source line; forming a second conductive material layer on the second interlayer insulating layer to fill up the first, second and third plug openings; and removing a portion of the second conductive material layer on the second interlayer insulating layer.

According to an embodiment of the present invention, the bit lines and the dummy bit lines are formed by forming a third conductive material layer on the second interlayer insulating layer; and patterning the third conductive material layer to form the bit lines and the dummy bit lines, wherein the dummy bit lines formed on the second plugs and third plugs are open.

In the present invention, the first conductive type well extension doped region is formed between the two adjacent second conductive type drain regions in the memory array to be an extension of the first conductive type well. Then, the first conductive type well extension doped region is electrically connected to the bit line through the well pick-up conductive layer and the well pick-up plug. Therefore, the resistance of the first conductive type well can be reduced, and thus the electrical conductivity of the channel region is increased. As a result, the device operation speed is increased and the device performance is improved.

Furthermore, because the well pick-up structure and the source line plug are located at the same two memory columns, the well pick-up structure does not additionally occupy the area of the memory array or the region for the word line and bit line, and the non-uniform line width problem does not exited. Hence, the optical proximity effect can be avoided and the process window is increased. Proximity effect can be avoided and the process window can be increased.

In addition, the well pick-up structure and the source line plug are formed at the same time, such that the process is simplified and the process window can be further increased.

In order to the make aforementioned and other objects, features and advantages of the present invention comprehensible, a preferred embodiment accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
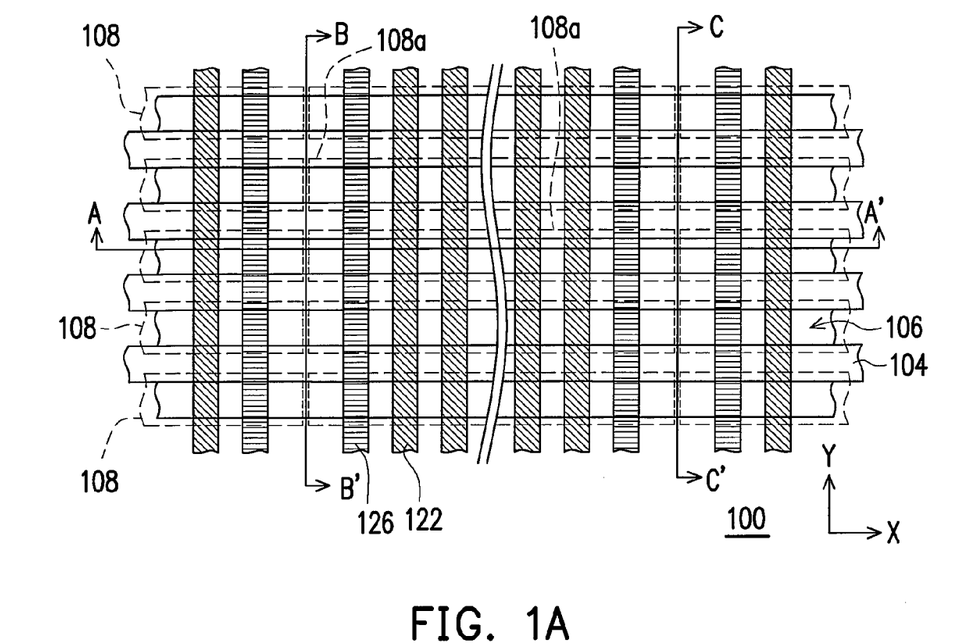
FIGS. 1A-1F are top views showing the process of manufacturing a well pick-up structure of a non-volatile memory according to an embodiment of the present invention.
Figure 1B:
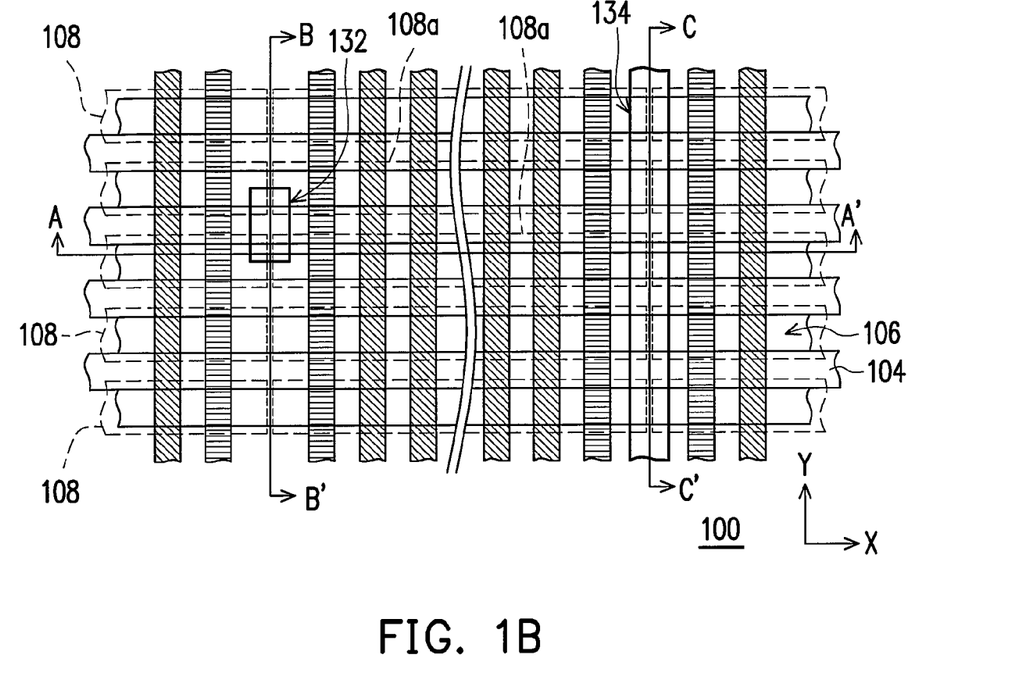
Figure 1C:
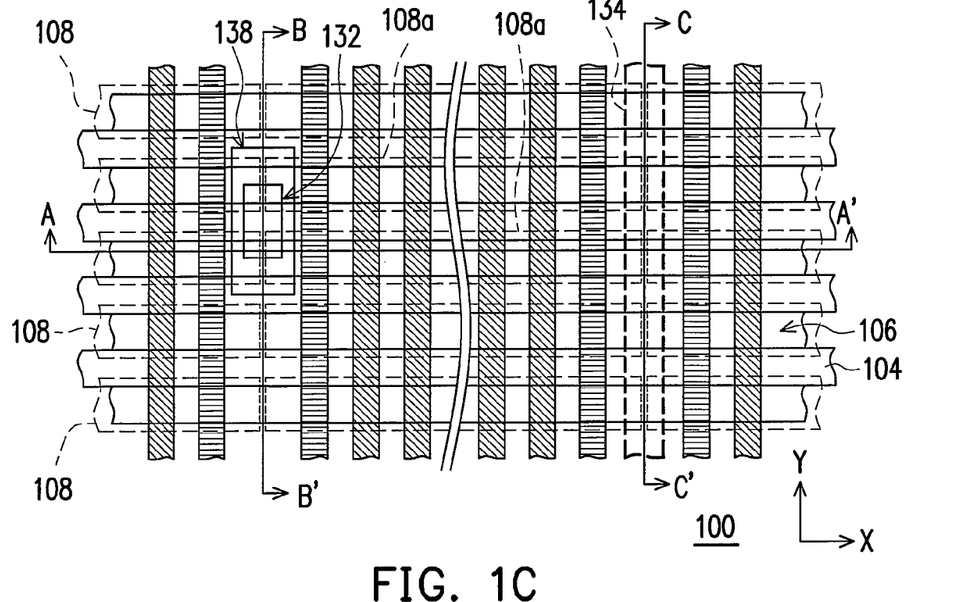
Figure 1D:
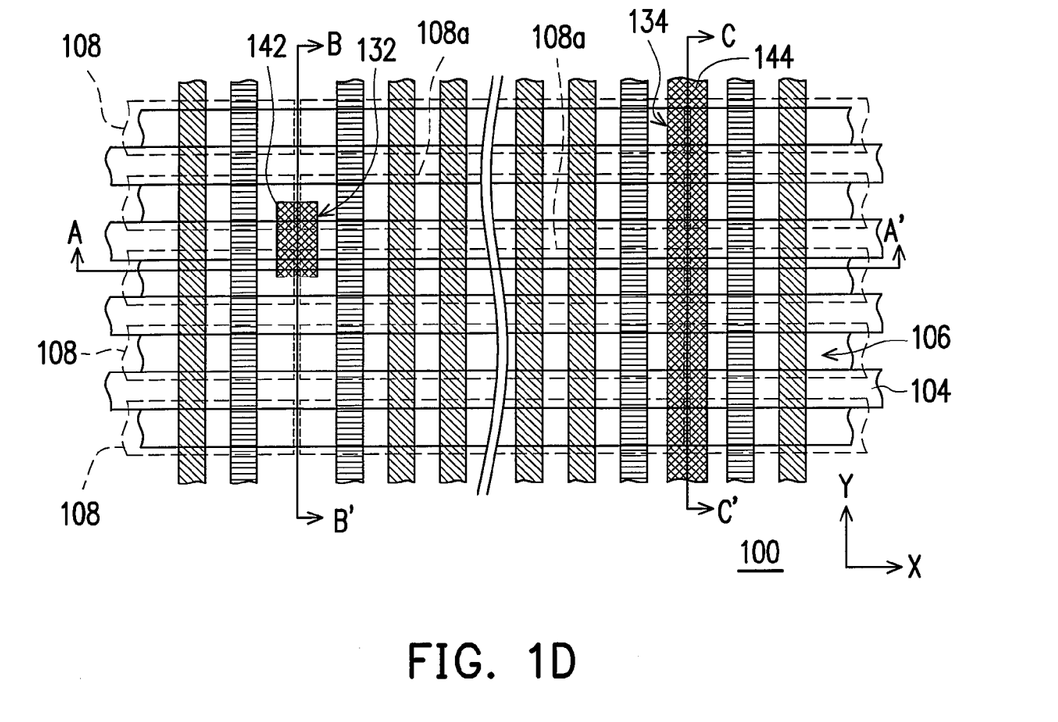
Figure 1E:
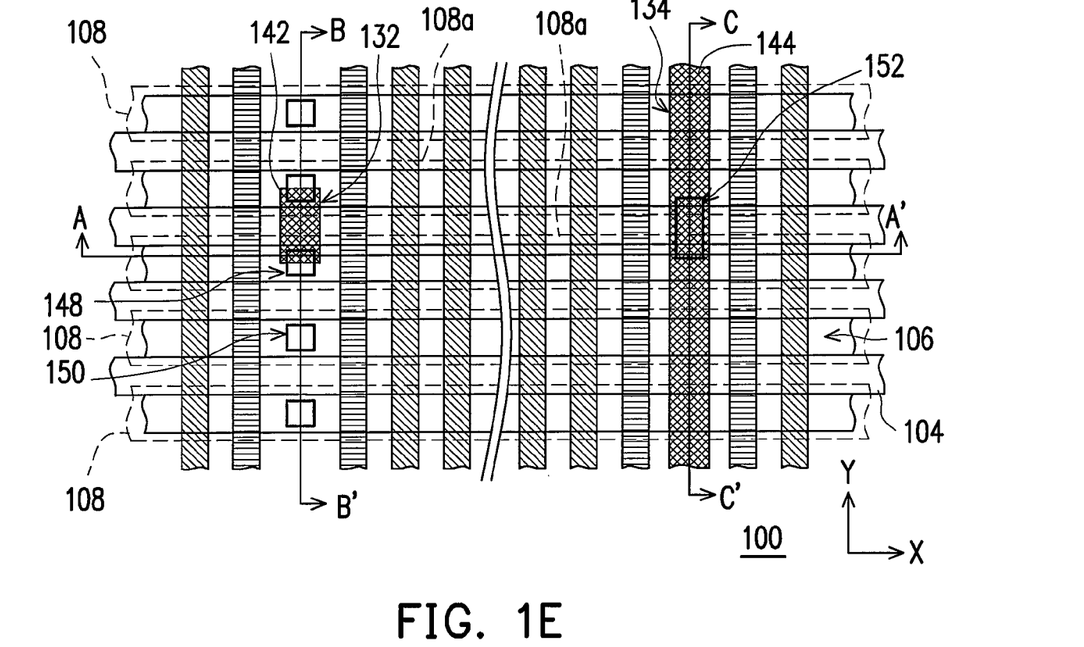
Figure 1F:
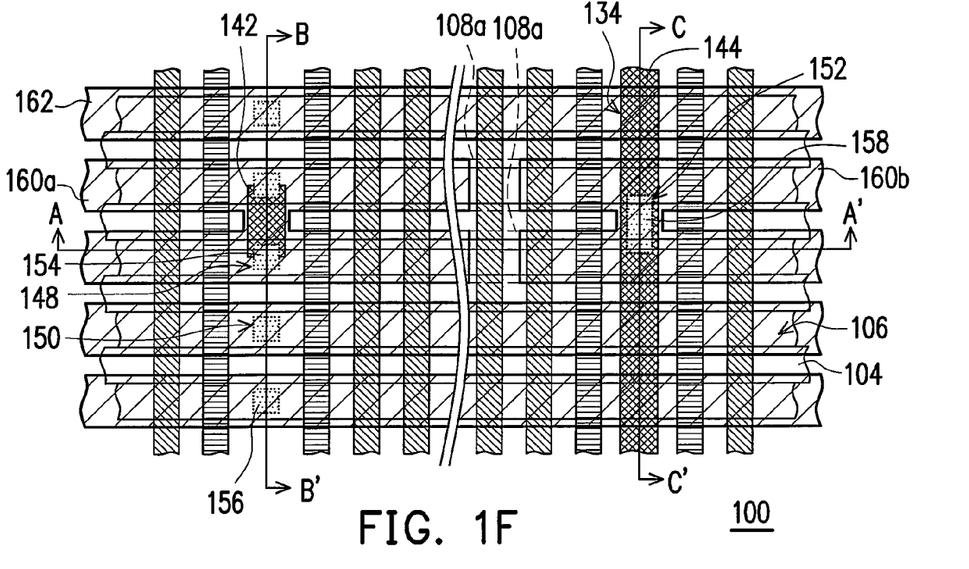
Figure 2A:
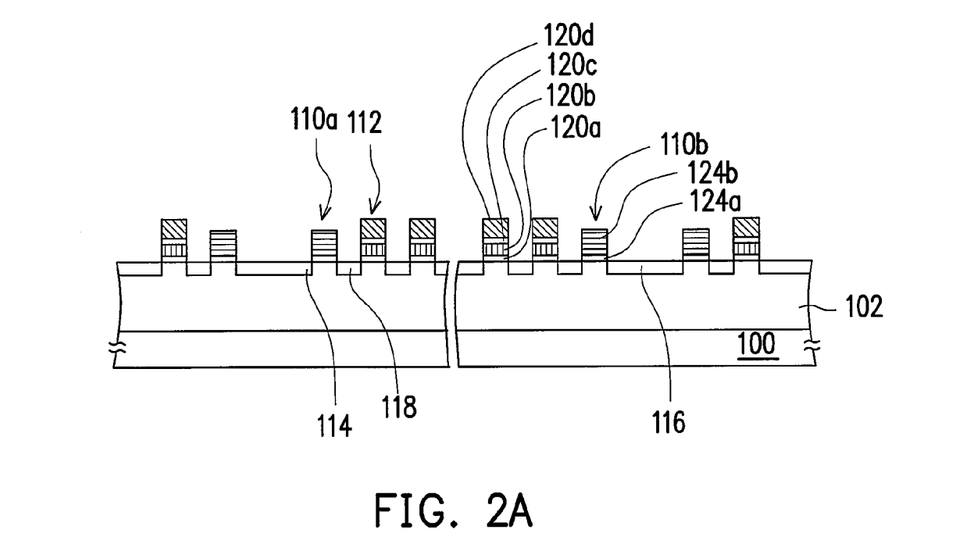
FIGS. 2A-2F are cross-sectional views along line A-A' of FIGS. 1A-1F.
Figure 2B:
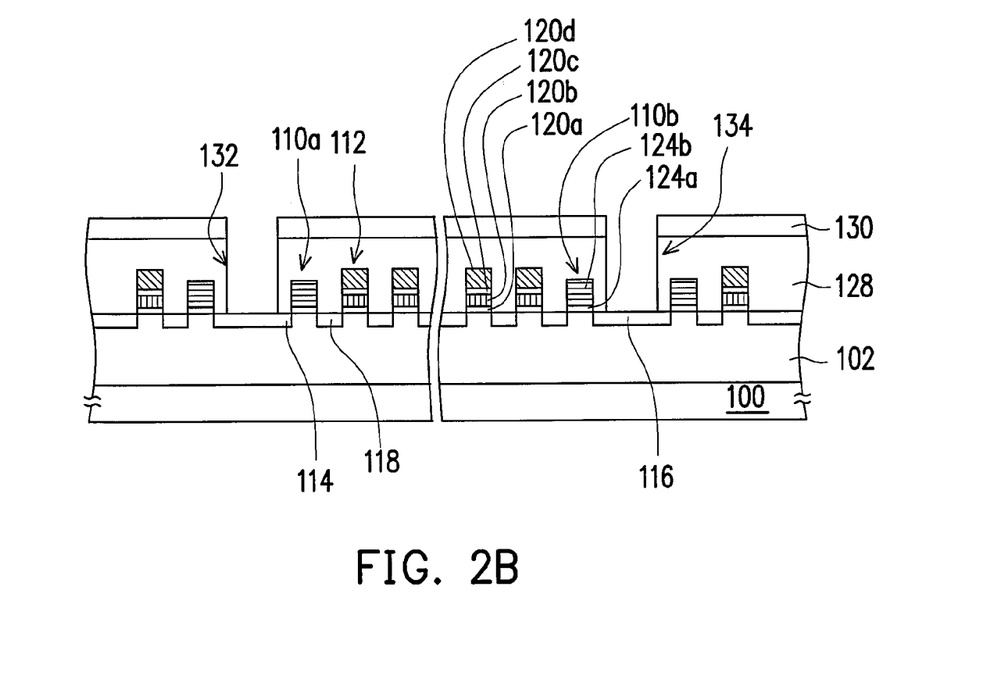
Figure 2C:
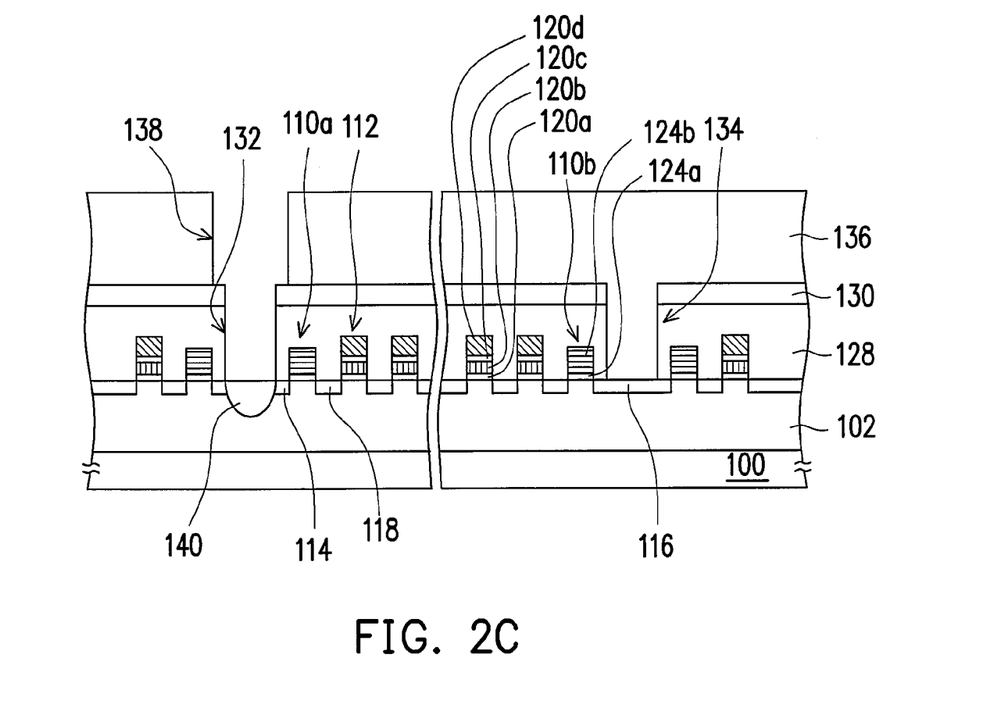
Figure 2D:
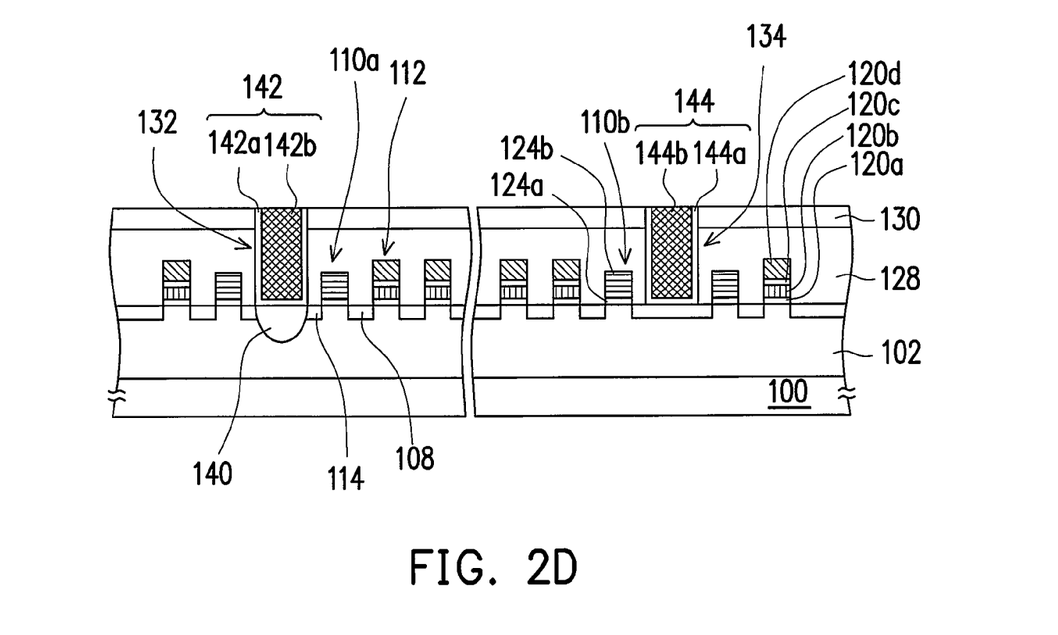
Figure 2E:
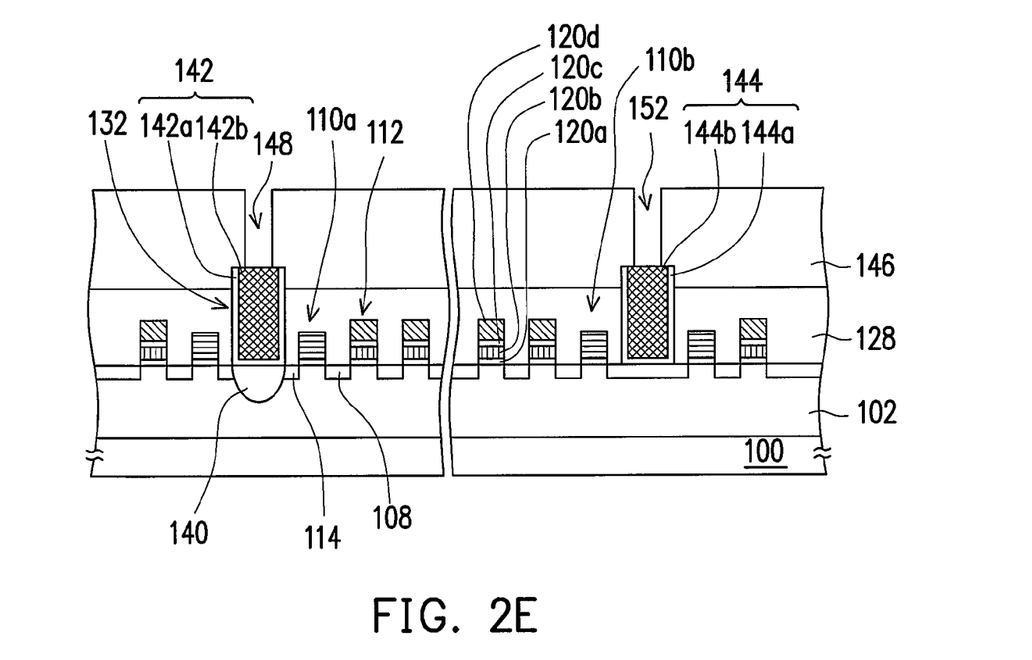
Figure 2F:
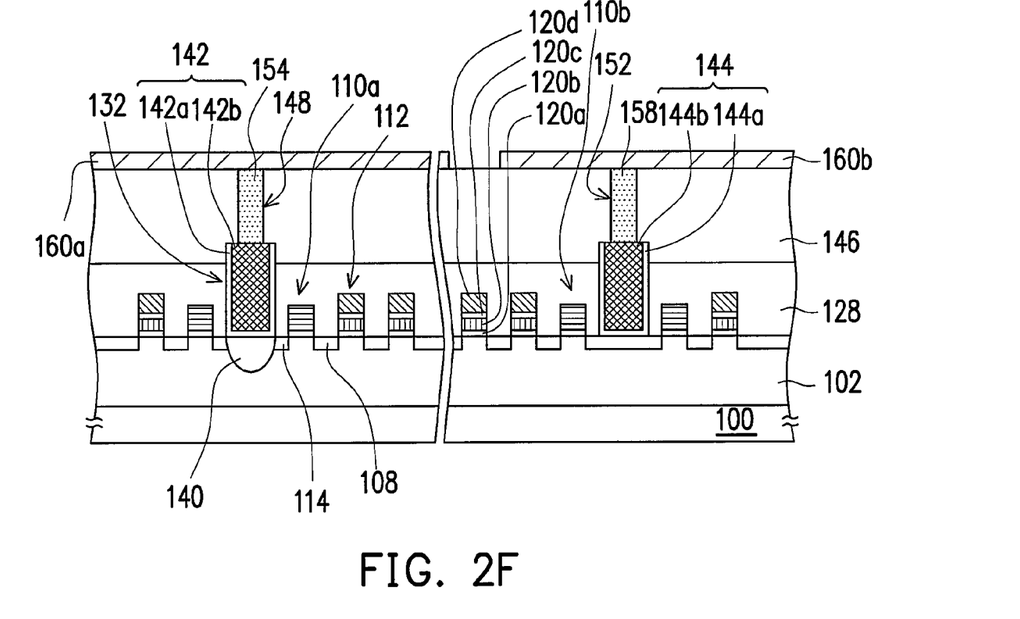

FIGS. 1A-1F are top views showing the process of manufacturing a well pick-up structure of a non-volatile memory according to an embodiment of the present invention. FIGS. 2A-2F are cross-sectional views along line A-A' of FIGS. 1A-1F.

Figure 3A:
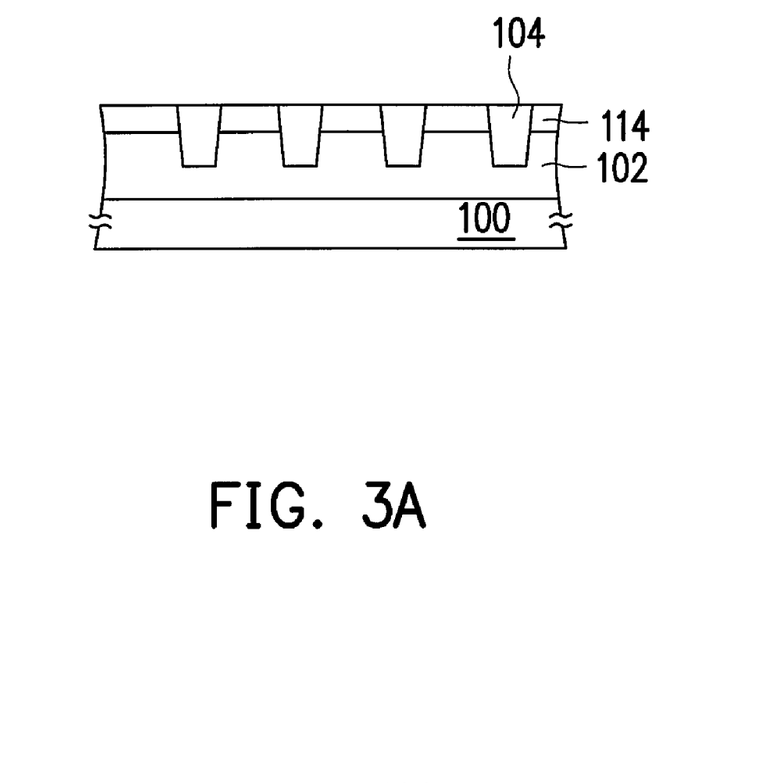
FIGS. 3A-3F are cross-sectional views along line B-B' of FIGS. 1A-1F.
Figure 3B:
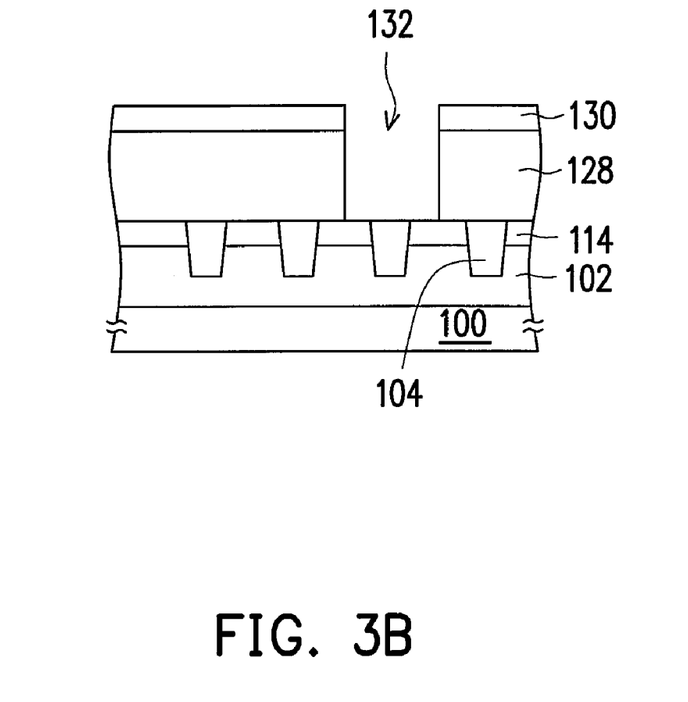
Figure 3C:
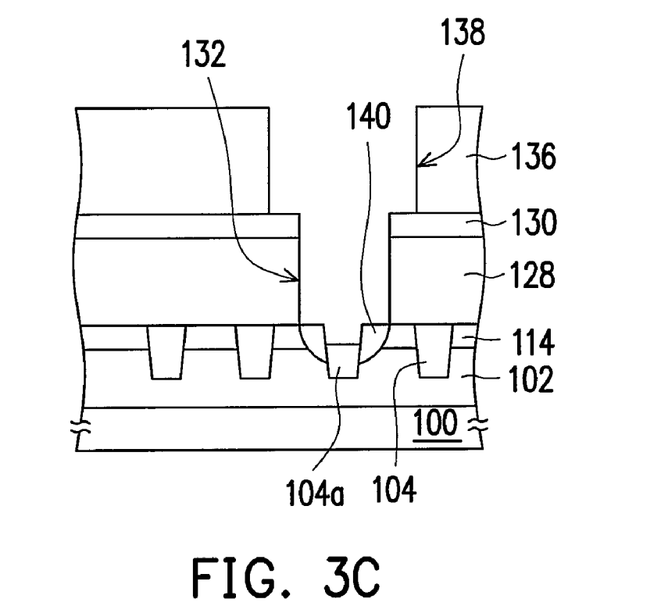
Figure 3D:
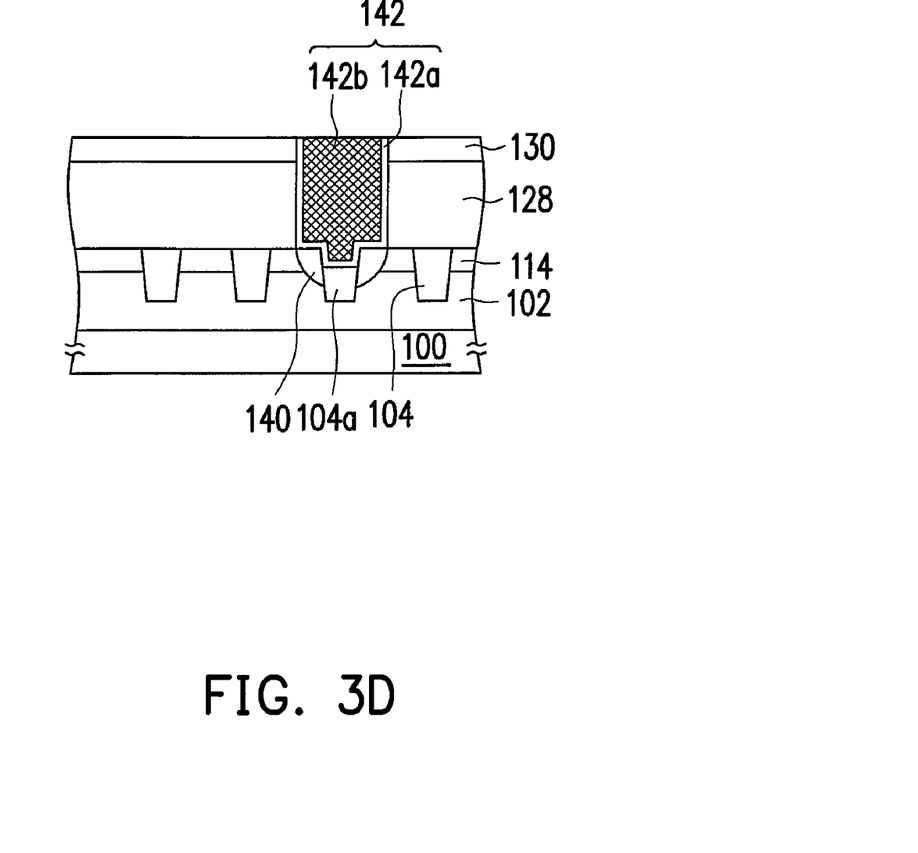
Figure 3E:
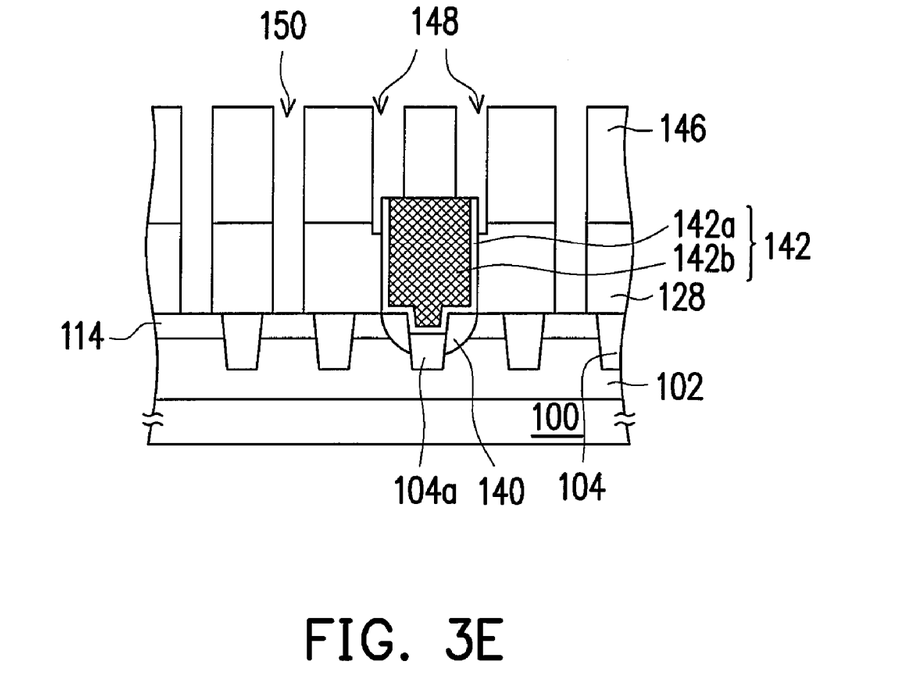
Figure 3F:
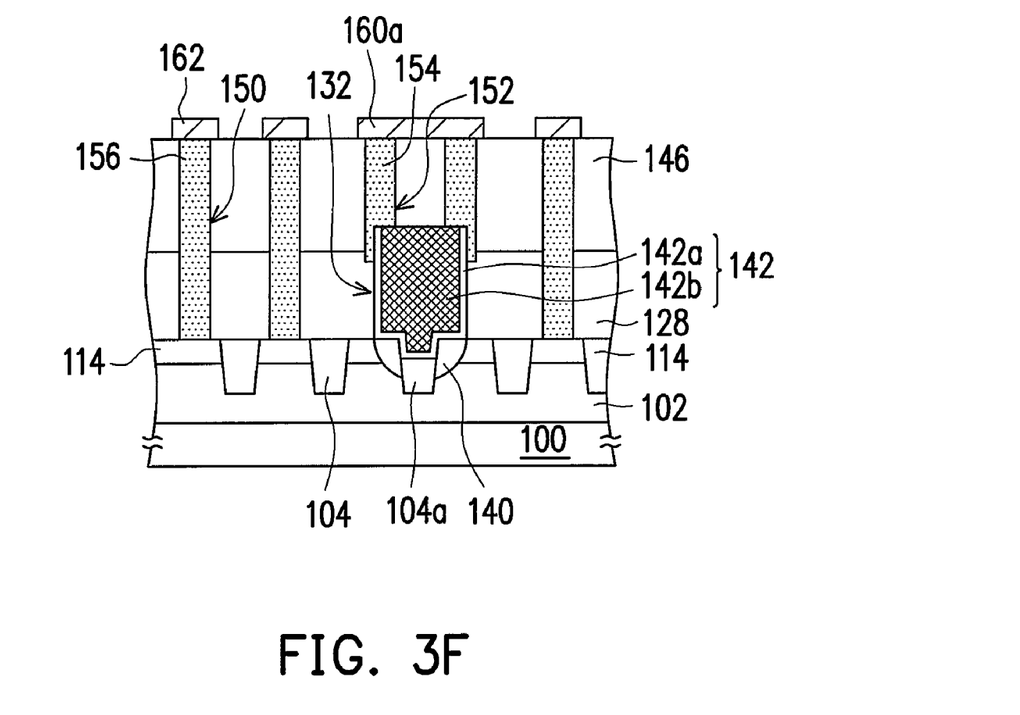
Figure 4A:
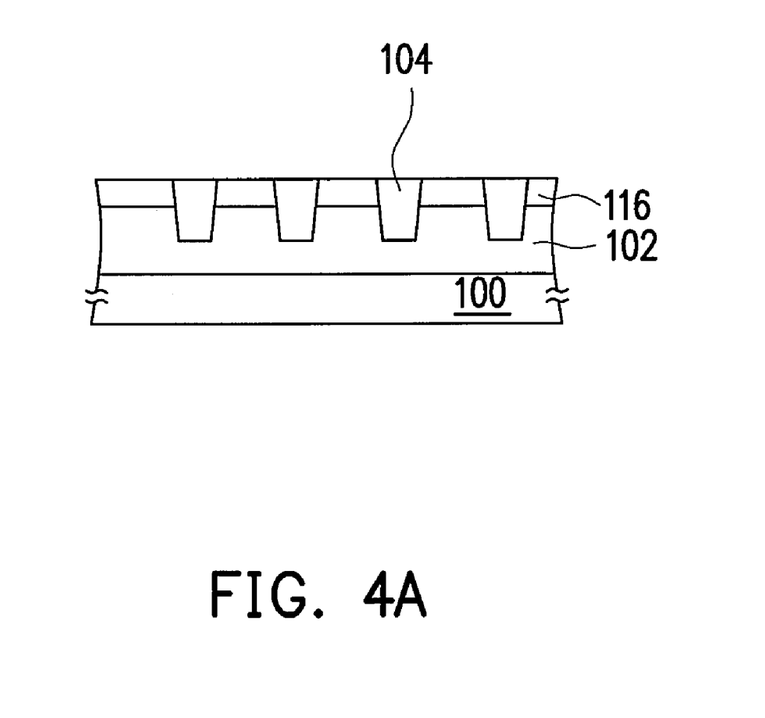
FIGS. 4A-4F are cross-sectional views along line C-C' of FIGS. 1A-1F.
Figure 4B:
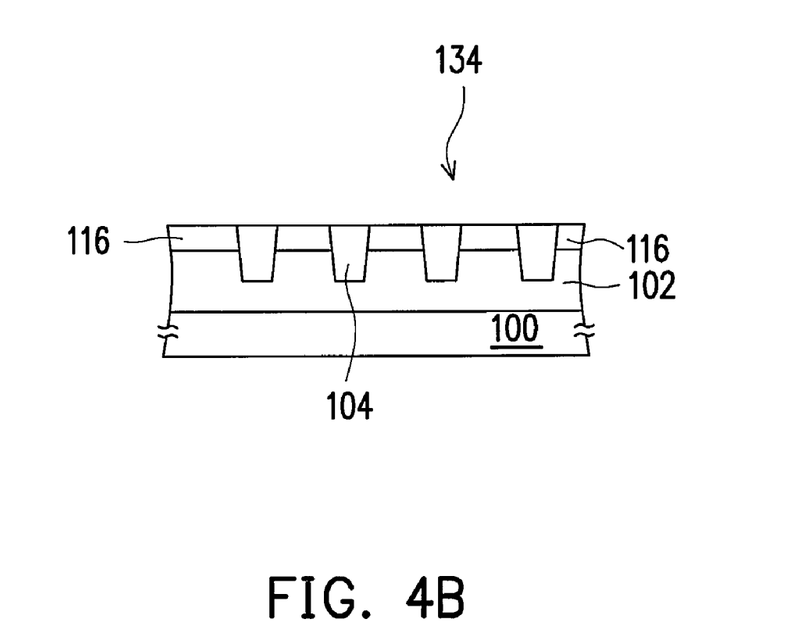
Figure 4C:
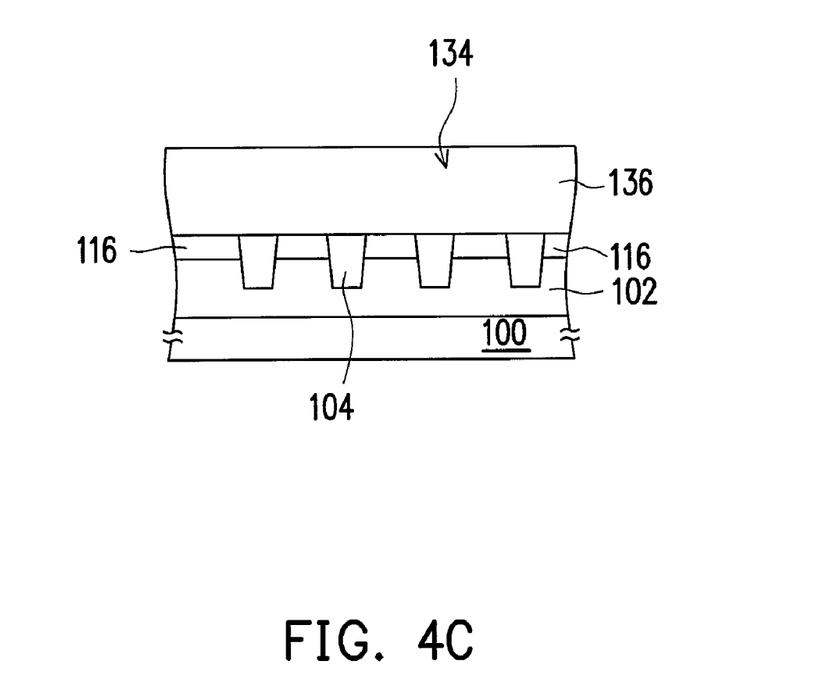
Figure 4D:
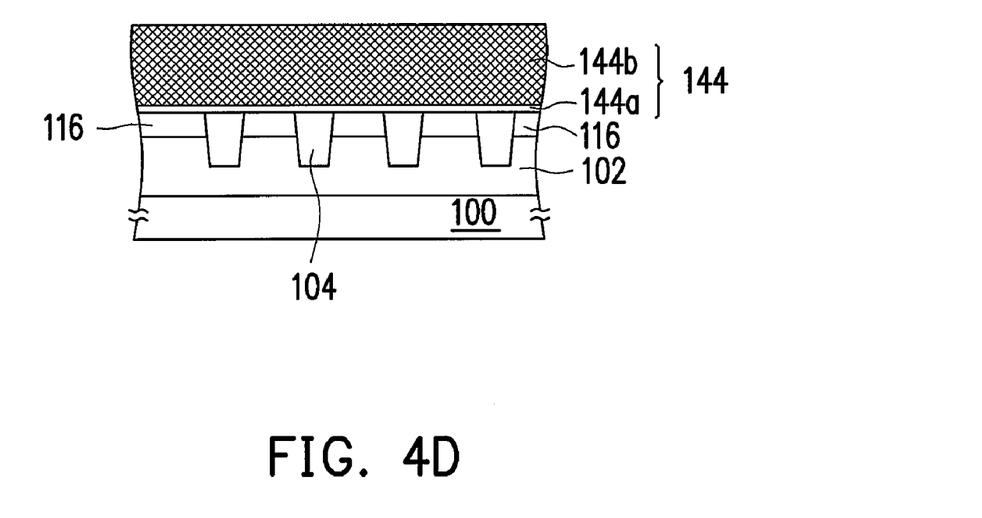
Figure 4E:
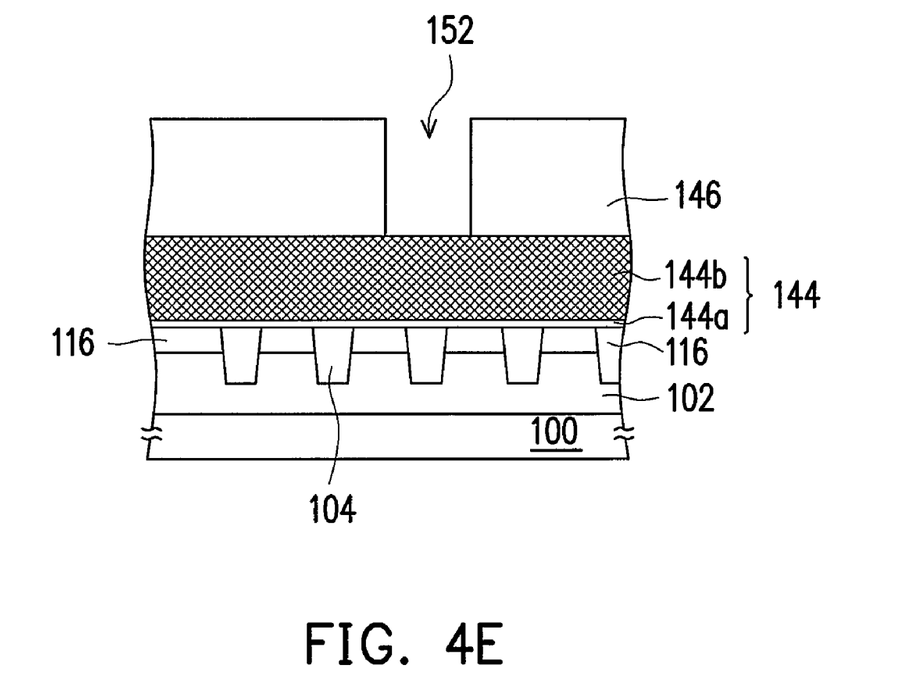
Figure 4F:
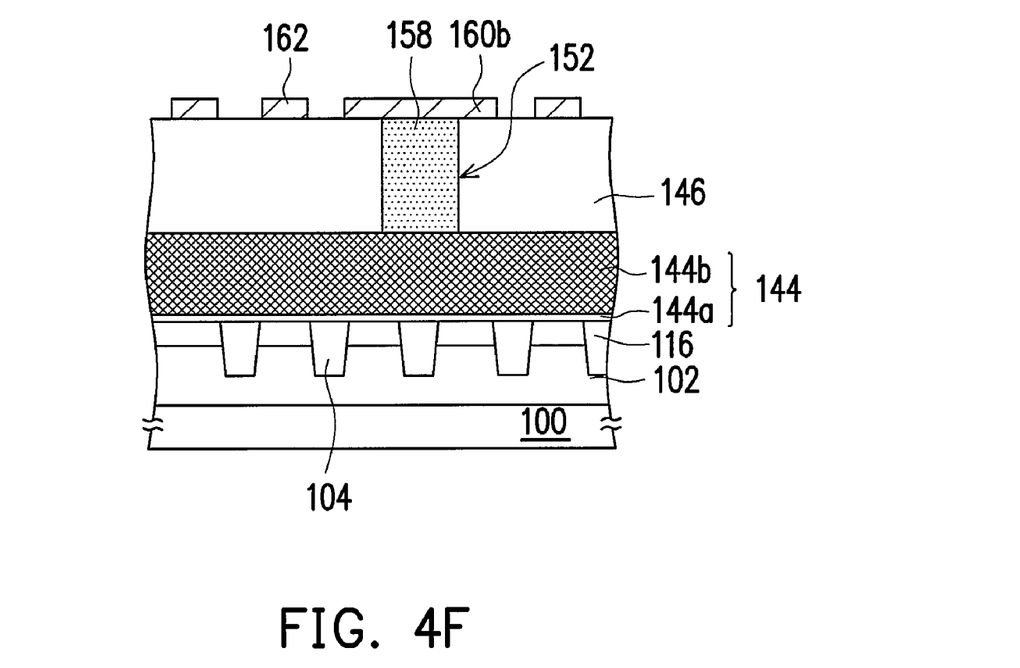

FIGS. 3A-3F are cross-sectional views along line B-B' of FIGS. 1A-1F. FIGS. 4A-4F are cross-sectional views along line C-C' of FIGS. 1A-1F.

As shown in FIGS. 1A, 2A, 3A and 4A, a substrate 100, such as a silicon substrate, is provided. The substrate 100 has a first conductive type well 102 therein. Then, a plurality of device isolation structures 104 are formed in the substrate 100 to define an active region 106 between the adjacent device isolation structures 104. The device isolation structure 104 is, for example, a shallow trench isolation structure or a field oxide layer. The shallow trench isolation structure or the field oxide layer can be formed by any well known method. The device isolation structures 104 are arranged in parallel along X direction (column direction).

A plurality of memory columns 108 are formed on the substrate 100. Each of the memory columns 108 includes, for example, two select transistors 110a, 110b, a plurality of memory cells 112, a second conductive type drain region 114 and a second conductive type source region 116. The plurality of memory cells 112 are connected in series between the second conductive type source region 116 and a second conductive type drain region 114. The select transistor 110b is formed between the memory cells 112 and the second conductive type source region 116, while the select transistor 110a is formed between the memory cells 112 and the second conductive type drain region 114. Adjacent two of the memory cells 112 are connected to each other through the doped region 118 therebetween; the memory cell 112 and the select transistor 110a are connected to each other through the doped region 118 therebetween; and the memory cell 112 and the select transistor 110b are also connected to each other through the doped region 118 therebetween.

Each of the memory cells 112 comprises a tunneling dielectric layer 120a, a floating gate 120b, an inter-gate dielectric layer 120c and a control gate 120d on the substrate 100. In the Y direction (row direction), the control gates 120d of the memory cells 112 at each row are connected to one word line 122, wherein the word lines 112 are arranged in parallel along Y direction (row direction).

The select transistors 110a, 110b are respectively comprises a select gate dielectric layer 124a and a select gate 124b on the substrate 100. In the Y direction (row direction), the select gates 124b of the select transistors 110a, 110b at each row are connected to one select gate line 126, wherein the select gate lines 126 are arranged in parallel along Y direction (row direction). The memory columns 108 can be formed by any well known methods, and thus is not described herein. In the memory columns 108, a source line plug and a well pick-up structure are formed on at least two of the memory columns 108, and the two memory columns 108 are not used to store data. Hence, these two memory columns 108 are so-called dummy memory columns 108a in the following description.

Please refer to FIGS. 1B, 2B, 3B and 4B, an interlayer insulating layer 128 is formed over the substrate 100. The material for the interlayer insulating layer 128 is, for example, silicon oxide, phosphosilicate glass, borophosphosilicate glass or other suitable dielectric materials, and the interlayer insulating layer 128 is formed by, for example, chemical vapor deposition. Next, a mask layer 130 is formed on the interlayer insulating layer 128. The material for the mask layer 130 is, for example, silicon nitride or other suitable materials, and the mask layer 130 is formed by chemical vapor deposition, for example.

Then, a patterned photo resist layer (not shown) is formed on the mask layer 130, and the patterned photo resist layer exposes the block region corresponding to the second conductive type drain region 114 and the strip region corresponding to the second conductive type source region 106 of the dummy memory column 108a. The patterned photo resist layer is formed, for example, by forming a photo resist layer by spin-on coating and then performing a patterning process with a photolithography process. Thereafter, the exposed mask layer 130 is removed by using the patterned photo resist layer as a mask, and the removing method is, for example, an etching process. Next, the patterned photo resist layer is removed, and the removing method is, for example, removing most of the photo resist layer by ashing process, and then removing the photo resist residue by cleaning process. Next, the exposed interlayer insulating layer 120 is removed by using the patterned mask layer 130 as a mask to form an opening 132 and a trench 134. The exposed interlayer insulating layer 120 is removed by, for example, etching process. In particular, the opening 132 exposes the two adjacent second conductive type drain regions 114 and the device isolation structure 104 between these two adjacent second conductive type drain regions 114. In addition, the trench 134 exposes all of the second conductive type source regions 116 in the Y direction. The first conductive type is, for example, P type, and the second conductive type is, for example, N type. Also, the first conductive type can be N type, and the second conductive type can be P type Please refer to FIGS. 1C, 2C, 3C and 4C. A mask layer 136 is formed on the mask layer 130, and the mask layer 136 covers the whole trench 134 and has an opening 138 therein. The opening 138 and the opening 132 together expose the second conductive type drain region 114. The material of the mask layer 136 is, for example, a photo resist, and the mask layer 136 is formed by, for example, forming a photo resist layer (not shown) by spin-on coating and then patterning the photo resist layer by photolithography process. Thereafter, the device isolation structure 104 exposed by the opening 138 and the opening 132 is removed so as to form a device isolation structure 104a. The top surface of the device isolation structure 104a is lower than the surface of the substrate 100. The method for removing a portion of the device isolation structure 104 in the openings 132,134 is, for example, by etching process using the mask layer 136 and the mask layer 130 as a mask.

Next, a first conductive type well extension doped region 140 is formed in the substrate 100 exposed by the opening 138 and the opening 132. The first conductive type well extension doped region 140 is formed by, for example, performing an ion implantation process using the mask layer 136 and the mask layer 132 as a mask to form the first conductive type well extension doped region 140 in the substrate 100 exposed by the openings 132,138. In particular, because a portion of the device isolation structure 104 has been removed, the ions can be implanted deeply, thereby the first conductive type well extension doped region 140 having deeper doping depth and wider doping area is formed.

Next, please refer to FIGS. 1D, 2D, 3D and 4D, the mask layer 136 is removed to expose the trench 134. The mask layer 136 is removed by, for example, performing an ashing process to remove most of the photo resist layer, and then removing the photo resist residue by cleaning process. According to an embodiment, after removing the mask layer 136, a rapid thermal annealing process is further performed to repair the exposed surface of the substrate 100 damaged by the etching process.

After that, a well pick-up conductive layer 142 is formed in the opening 132 and a source line 144 is formed in the trench 134. The well pick-up conductive layer 142 is electrically connected to the first conductive type well 102 through the first conductive type well extension doped region 140. The well pick-up conductive layer 142 and the source line 144 are formed by the following steps, for example. A conductive material layer is formed over the substrate 100 to fill up the opening 132 and the trench 134, and then a chemical-mechanical polishing process is carried out by using the mask layer 130 as a polishing stop layer to remove a portion of the conductive material layer. In an embodiment, the well pick-up conductive layer 142 is, for example, comprised of an adhesive layer/barrier layer 142a and a conductive layer 142b, and the source line 144 is, for example, comprised of an adhesive layer/barrier layer 144a and a conductive layer 144b. The adhesive layer/barrier layer 142a and the adhesive layer/barrier layer 144a can improve adhesion of metal materials or block diffusion of metal materials to prevent spiking effect. The adhesive layer/barrier layer 142a and the adhesive layer/barrier layer 144a is, for example, made of tantalum, tantalum nitride, titanium, titanium nitride and combinations thereof, and is formed by physical vapor deposition or chemical vapor deposition. The material for the conductive layer 142b and the conductive layer 144b is, for example, aluminum, tungsten or copper, and the forming method thereof is a physical vapor deposition or a chemical vapor deposition.

Please refer to FIGS. 1E, 2E, 3E and 4E, the mask layer 130 is removed. Then, an interlayer insulating layer 146 is formed on the interlayer insulating layer 128. The interlayer insulating layer 146 the interlayer insulating layer 128 are patterned to form plug openings 148, 150, 152. The plug opening 148 is located over the well pick-up conductive layer 142 and exposes the well pick-up conductive layer 142; the plug opening 150 exposes the second conductive type drain region 114; and the plug opening 152 exposes the source line 144. The plug opening 148 and the plug opening 152 are positioned over the same two adjacent dummy memory columns 108a. The method for patterning the interlayer insulating layers 146, 138 is, for example, a photolithography and etching process.

Please refer to FIGS. 1F, 2F, 3F and 4F, a conductive material layer (not shown) is formed on the interlayer insulating layer 146 to fill up the plug openings 148, 150, 152. The material of the conductive material layer is, for example, tungsten, copper, aluminum or doped polysilicon. In an embodiment, if the doped polysilicon is used as the material for the conductive material layer, it is formed by forming a polysilicon material by chemical vapor deposition and then performing an ion implantation process; or performing a chemical vapor deposition process with in-situ doping. In another embodiment, if the conductive material layer is tungsten, copper or aluminum, it can be formed by physical vapor deposition or chemical vapor deposition. Also, an adhesive layer/barrier layer (not shown) can be selectively formed. After that, a chemical-mechanical polishing process is carried out to remove the conductive material layer on the interlayer insulating layer 146, and therefore a well pick-up plug 154 is formed in the plug opening 148; a bit line plug 156 is formed in the plug opening 150; and a source line plug 158 is formed in the plug opening 152. The bit line plug 156 is electrically connected to the second conductive type drain region 112; the well pick-up plug 154 is electrically connected to the well pick-up conductive layer 142; and the source line plug 157 is electrically connected to the source line 144. In particular, the source line plug 158 and the well pick-up plug 154 are located over the same two adjacent memory columns 108a.

Next, a conductive material layer (not shown) is formed on the interlayer insulating layer 146. The material of the conductive material layer is, for example, tungsten, copper, aluminum or doped polysilicon. In an embodiment, if the doped polysilicon is used as the material for the conductive material layer, it is formed by forming a polysilicon material by chemical vapor deposition and then performing an ion implantation process; or performing a chemical vapor deposition process with in-situ doping. In another embodiment, if the conductive material layer is tungsten, copper or aluminum, it can be formed by physical vapor deposition or chemical vapor deposition. Also, an adhesive layer/barrier layer (not shown) can be selectively formed. Then, the conductive material layer is patterned to form a plurality of bit lines 162 and dummy bit lines 160a, 160b. The dummy bit lines 160a, 160b are respectively positioned over the well pick-up plug 142 and the source line plug 144, and the dummy bit lines 160a, 160b between the well pick-up plug 142 and the source line plug 144 are open (not electrically connected to each other).

It should be noted that the first conductive type well extension doped region 140, the well pick-up conductive layer 142, the well pick-up plug 154 and the dummy bit line 160a are electrically connected to each other to form a well pick-up structure. Therefore, the well pick-up structure can be used as an electrical extension path for the first conductive type well 102 to reduce the resistance of the first conductive type well 102 so as to increase the electrical conductivity of the channel region. As a result, the operation speed of the non-volatile memory can be increased and the device performance can be improved.

In the conventional process, each source line plug 158 would occupy the space of two memory columns (dummy memory columns 108a). However, in the present invention the well pick-up structure and the source line plug 158 are located over the same two adjacent memory columns. Therefore, the well pick-up structure does not additionally occupy the area of the memory array or the region for the word line and bit line, and the non-uniform line width problem is not existed. Hence, the optical proximity effect can be avoided and the process window is increased. Proximity effect can be avoided and the process window can be increased. Moreover, in the present invention the number of the well pick-up structure depends on the number of the source line plug.

Additionally, the method for forming the well pick-up structure of the present invention is added several simple processes before forming the source line plugs, such that the well pick-up structure and the source line plug can be formed at the same time. Therefore, the method of forming the well pick-up structure of the present invention is simple and has high process window.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a well pick-up structure of a non-volatile memory, comprising:
    providing a substrate having a first conductive type well therein;
    forming a plurality of device isolation structures in the substrate;
    forming a plurality of dummy memory columns on the substrate, wherein each of the dummy memory columns comprises a second conductive type source region and a second conductive type drain region;
    forming a first interlayer insulating layer over the substrate;
    forming an opening in the first interlayer insulating layer, wherein the opening exposes the second conductive type drain regions and one of the plurality of device isolation structures between each pair of second conductive type drain regions of the dummy memory columns;
    removing a portion of the device isolation structure exposed by the opening;
    forming a first conductive type well extension doped region in the substrate exposed by the opening;
    forming a well pick-up conductive layer in the opening, wherein the well pick-up conductive layer is electrically connected to the first conductive type well through the first conductive type well extension doped region; and
    forming a plurality of dummy bit lines over the substrate, wherein the dummy bit lines are electrically connected to the well pick-up conductive layer.

2. The method of claim 1, wherein the steps of forming the well pick-up conductive layer comprise:
    forming a first conductive material layer over the substrate to fill up the opening; and
    removing the first conductive material layer on the first interlayer insulating layer to form the well pick-up conductive layer in the opening.

3. The method of claim 2, wherein the first conductive material layer comprises tungsten, copper or aluminum.

4. The method of claim 2, wherein removing the first conductive material layer on the first interlayer insulating layer comprises performing a chemical-mechanical polishing process.

5. The method of claim 2, further comprising forming an adhesive layer/barrier layer after forming the opening in the first interlayer insulating layer and before forming the well pick-up conductive layer in the opening.

6. The method of claim 5, wherein the adhesive layer/barrier layer is selected from the group consisting of tantalum, tantalum nitride, titanium, titanium nitride and combinations thereof.

7. The method of claim 1, further comprising performing a rapid thermal annealing process after forming the first conductive type well extension doped region.

8. The method of claim 1, further comprising forming a plurality of plugs over the substrate for electrically connecting the dummy bit lines and the well pick-up conductive layer.

9. The method of claim 8, wherein the steps of forming the plugs comprise:
    forming a second interlayer insulating layer over the substrate;
    patterning the second interlayer insulating layer and the first interlayer insulating layer to form a plurality of plug openings exposing the well pick-up conductive layer;
    forming a second conductive material layer on the second interlayer insulating layer to fill up the plug openings; and
    removing a portion of the second conductive material layer on the second interlayer insulating layer.

10. The method of claim 9, wherein the second conductive material layer comprises tungsten, copper, aluminum or doped polysilicon.

11. The method of claim 1, wherein the steps of forming the opening in the first interlayer insulating layer comprise:
    forming a patterned mask layer on the first interlayer insulating layer;
    removing a portion of the first interlayer insulating layer by using the mask layer as a mask to form the opening; and
    removing the mask layer.

12. A method of manufacturing a well pick-up structure of a non-volatile memory, comprising:
    providing a substrate having a first conductive type well therein;
    forming a plurality of device isolation structures in the substrate, wherein the device isolation structures extend toward a first direction;
    forming a plurality of memory columns on the substrate, wherein each of the memory columns comprises a second conductive type source region and a second conductive type drain region;
    forming a first interlayer insulating layer over the substrate;
    forming an opening and a trench in the first interlayer insulating layer, wherein the opening exposes two adjacent second conductive type drain regions and the device isolation structure between the two adjacent second conductive type drain regions of the memory columns, and the trench extends toward a second direction and exposes the second conductive type source regions, the second direction intersecting the first direction;
    removing a portion of the device isolation structure exposed by the opening;
    forming a first conductive type well extension doped region in the substrate exposed by the opening;
    forming a well pick-up conductive layer in the opening, wherein the well pick-up conductive layer is electrically connected to the first conductive type well through the first conductive type well extension doped region, and forming a source line in the trench; and
    forming a plurality of bit lines and a plurality of dummy bit lines over the substrate, wherein the bit lines are electrically connected to the second conductive type source regions, the dummy bit lines are respectively electrically connected to the well pick-up conductive layer and the source line, and the dummy bit lines between the well pick-up conductive layer and the source line are open.

13. The method of claim 12, wherein the steps of forming the well pick-up conductive layer and the source line comprise:

forming a first conductive material layer over the substrate to fill up the opening and the trench; and removing the first conductive material layer on the first interlayer insulating layer to form the well pick-up conductive layer in the opening and form the source line in the trench.

14. The method of claim 13, wherein removing the first conductive material layer on the first interlayer insulating layer comprises performing a chemical-mechanical polishing process.

15. The method of claim 14, wherein the first conductive material layer comprises tungsten, copper or aluminum.

16. The method of claim 12, further comprising forming a mask layer covering the trench and exposing the opening on the first interlayer insulating layer before removing the portion of the device isolation structure in the opening; and removing the mask layer after forming the first conductive type well extension doped region in the substrate.

17. The method of claim 12, further comprising performing a rapid thermal annealing process after forming the first conductive type well extension doped region.

18. The method of claim 12, further comprising forming a plurality of first plugs electrically connecting the bit lines and the second conductive type drain regions, a plurality of second plugs electrically connecting the dummy bit lines and the well pick-up conductive layer and a plurality of third plugs electrically connecting the dummy bit lines and the source line.

19. The method of claim 18, wherein the steps of forming the first, second and third plugs comprise:

forming a second interlayer insulating layer over the substrate;

patterning the second interlayer insulating layer and the first interlayer insulating layer to form a plurality of first plug openings exposing the second conductive type drain regions, a plurality of second plug openings exposing the well pick-up conductive layer and a plurality of third plug openings exposing the source lines;

forming a second conductive material layer on the second interlayer insulating layer to fill up the first, second and third plug openings; and removing a portion of the second conductive material layer on the second interlayer insulating layer.

20. The method of claim 19, wherein the steps of forming the bit lines and the dummy bit lines comprise:

forming a third conductive material layer on the second interlayer insulating layer;

patterning the third conductive material layer to form the bit lines and the dummy bit lines, wherein the dummy bit lines formed on the second plugs and third plugs are open.

* * * * *